US008849224B2

(12) United States Patent
Björk

(10) Patent No.: US 8,849,224 B2
(45) Date of Patent: Sep. 30, 2014

(54) AGC LOW THRESHOLD SIGNAL LEVEL DETECTION

(75) Inventor: Vimar Björk, Göteborg (SE)

(73) Assignee: Optis Cellular Technology, LLC, Plano, TX (US)

(*) Notice: Subject to any disclaimer, the term of this patent is extended or adjusted under 35 U.S.C. 154(b) by 659 days.

(21) Appl. No.: 12/992,692

(22) PCT Filed: May 15, 2008

(86) PCT No.: PCT/EP2008/055978
§ 371 (c)(1),
(2), (4) Date: Nov. 15, 2010

(87) PCT Pub. No.: WO2009/138127
PCT Pub. Date: Nov. 19, 2009

(65) Prior Publication Data
US 2011/0070856 A1    Mar. 24, 2011

(51) Int. Cl.
*G06F 3/033* (2013.01)
*H03G 3/30* (2006.01)

(52) U.S. Cl.
CPC .................. *H03G 3/3052* (2013.01)
USPC ......... 455/130; 455/223; 455/234.1; 370/279

(58) Field of Classification Search
CPC ........ H03D 3/006; H03D 11/00; H03D 11/08
USPC ...................................... 455/130
See application file for complete search history.

(56) References Cited

U.S. PATENT DOCUMENTS

| 4,928,288 | A  | * | 5/1990  | D'Aria et al. .................. 375/287 |
| 6,420,934 | B1 | * | 7/2002  | Butler et al. .................. 330/279 |
| 2006/0077959 | A1 | | 4/2006 | Beckemeyer |
| 2007/0243843 | A1 | | 10/2007 | Shalash |

FOREIGN PATENT DOCUMENTS

| CN | 1236217 A | 11/1999 |
| CN | 1416622 A | 5/2003 |
| EP | 1 394 938 A | 3/2004 |

* cited by examiner

*Primary Examiner* — Ajibola Akinyemi
(74) *Attorney, Agent, or Firm* — Vincent J. Allen; James H. Ortega; Carstens & Cahoon, LLP

(57) ABSTRACT

The invention provides a receiver comprising an input end, an Rx-chain with at least one regulating means and an output end. The receiver further comprises a feedback loop in the Rx-chain, the regulating means arranged for providing a higher or lower gain setting. The feedback loop comprises an AGC Multilevel threshold detector unit, AMU. The AMU comprises at least one Low Multilevel Threshold Detector, LMTD, and the LMTD comprises at least two threshold detectors, each detector having an associated low threshold level and detection interval, the length of the detection interval being shorter the lower the low threshold level is arranged to be set. The higher gain setting being arranged to be initiated through the feedback loop when the absolute level of an AGC input signal has been below at least one of the low threshold levels during the entire detection interval associated with that low threshold level. The invention also provides a communication system comprising the receiver, an AGC Multilevel threshold detector Unit (AMU) and a method to adjust the gain in a receiver.

18 Claims, 7 Drawing Sheets

AGC LOW THRESHOLD SIGNAL LEVEL DETECTION

TECHNICAL FIELD

The invention relates to the field of receivers using Automatic Gain Control (AGC). The receivers can be used in any application such as telecommunication applications where the receivers can be used in base stations or mobile phones.

BACKGROUND

In many receivers, and especially in a high performance multi carrier receiver, the linearity and dynamic range requirements are very challenging. To meet the demanding requirements, automatic gain control (AGC) can be used to adjust the dynamic range of the receiver according to the received signal level and thus relax the dynamic range of the receiver circuitry. In such a receiver an AGC control function is needed.

FIG. 1 schematically shows the principles of a prior art AGC receiver 100 with an input terminal 101 and an output terminal 102. The components coupled in series between the input and output terminals are part of an Rx-chain. An input signal at input terminal 101 passes an attenuator 103, an amplifier 104, a band pass filter 105 and an Analogue Digital Converter (ADC), 106. After the ADC the signal is divided in a first branch 109 entering an AGC unit 107 and a second branch 110 entering an AGC compensation unit 108. The AGC unit 107 includes one high and one low threshold detector for detecting if the signal in the first branch entering the AGC unit 107 exceeds one predetermined high threshold level or is below one predetermined low threshold level. The AGC unit 107 initiates an increase or decrease of the attenuation in the attenuator 103 through a control signal via a connection 111. When a low threshold level is detected the attenuation will be decreased and when a high threshold level is detected the attenuation will be increased. In order to have the same signal level at the input terminal 101 and the output terminal 102, a further control signal from the AGC unit via a connection 112 will initiate a compensating gain increase or decrease at an AGC compensation unit 108. When the attenuator decreases attenuation, the AGC compensation unit will decrease the gain and when the attenuator increases the attenuation the AGC compensation unit will increase the gain.

The AGC unit 107 according to prior art is shown in FIG. 2. The AGC unit 107 consists of a high, 201, and a low, 202, threshold detector which controls the AGC level up or down. The AGC control unit, 203, controls the analogue attenuation and the AGC compensation. The AGC input signal 204 is divided in two paths, one fed to the high threshold detector for detection of a high threshold level and one to the low threshold detector for detection of a low threshold level. When the high threshold level is detected the high threshold detector sends a detection signal to the AGC control unit 203 and when a low threshold level is detected the low threshold detector sends a further detection signal to the AGC control unit. The AGC control unit produces the two control signals mentioned above in association with FIG. 1. When the high threshold level is detected the control signal informs the attenuator 103 to increase attenuation and the further control signal informs the AGC compensation unit 108 to increase gain to compensate for the attenuation. This means that the attenuation "AGC attenuation" is compensated with the same amount of gain increase "AGC compensation" and the level of the input signal at the input terminal 101 will be equal to the level of the AGC compensation unit output signal at the output terminal 102. When the low threshold level is detected the control signal informs the attenuator 103 to decrease attenuation and the further control signal informs the AGC compensation unit 108 to decrease gain to compensate for the decreased attenuation.

In an AGC receiver, it is important that the gain always is as high as possible without limiting the received signal in order to get the highest possible Signal to Noise Ratio (SNR) and thus the best performance. All AGC transitions, i.e. changes in the receiver gain controlled by the AGC unit, will however generate distortion due to imperfections between the gain change and the gain compensation circuitries.

For signals with Gaussian signal distribution, and thus a high Peak to Average Ratio (PAR), it is difficult to minimize the number of transitions and it has been necessary either to increase the hysteresis and/or to have a long integration time to estimate the signal level accurately for the lower AGC threshold, as will be explained in FIG. 3. The PAR value is defined as the envelope peak power value in relation to the average power value of the signal. A large hysteresis and/or a long time interval without peaks above the threshold level will degrade the performance in the receiver since the gain will not be maximized all the time. Today signals with close to Gaussian distribution are very common for new communication systems as for example in mobile telephone systems as GSM, CDMA, WCDMA or LTE. (GSM=Global System for Mobile communication, CDMA=Code Division Multiple Access, WCDMA=Wideband Code Division Multiple Access, LTE=Long Term Evolution)

FIG. 3 shows a high PAR signal 303 and a low PAR signal 304 as a function of time t on the horizontal axis 301 and signal power P on the vertical axis 302. The low threshold level 305 is marked on the power axis. To minimize the number of AGC transitions, i.e. the number of instances when the attenuation level is changed, a relatively long detection interval 306 has to be chosen. With the prior art solution of today the signal has to be below the threshold level 305 during the detection interval 306 before the attenuation is released and thus the gain of the analogue part of the AGC receiver is increased. This means that the analogue part of the receiver is working at a reduced gain during the relatively long detection interval 306. This will as mentioned above degrade the performance of the receiver since the gain will not be maximized at all times.

There is thus a need for an improved utilization of the dynamic range of the receiver by an improved solution for low threshold level detection that will allow the gain to be maximized during a longer part of the total operating time without increasing the number of AGC transitions.

SUMMARY

The object of the invention is to remove at least part of the above mentioned deficiencies with prior art solutions and to provide:
   a receiver,
   an AGC Multilevel threshold detector Unit (AMU),
   a communication system comprising a receiver, and
   a method to adjust the gain in a receiver
to solve the problem of providing an improved utilization of the dynamic range of the receiver by an improved solution for low threshold level detection that will allow the gain to be maximized during a longer part of the total receiver operating time without increasing the number of AGC transitions.

This object is achieved by providing a receiver comprising an input end, an Rx-chain with at least one regulating means and an output end. The receiver further comprises a feedback loop in the Rx-chain, said regulating means arranged for providing a higher or a lower gain setting wherein the feedback loop comprises an AGC Multilevel threshold detector Unit, AMU. The AMU comprises at least one Low Multilevel Threshold Detector, LMTD. Said LMTD comprises at least two threshold detectors. Each threshold detector has an associated low threshold level and detection interval. The length of each detection interval is shorter the lower the low threshold level is arranged to be set. The higher gain setting is arranged to be initiated through the feedback loop when the absolute level of an AGC input signal has been below at least one of the low threshold levels during the entire detection interval associated with that low threshold level.

The object is further achieved by providing an AGC Multilevel threshold detector Unit, AMU, wherein the AMU comprises at least one Low Multilevel Threshold Detector, LMTD. Said LMTD comprises at least two threshold detectors. Each threshold detector has an associated low threshold level and detection interval. The length of the detection interval is shorter the lower the low threshold level is arranged to be set.

The object is also achieved by providing a communication system comprising a receiver having an input end, an Rx-chain with at least one regulating means and an output end. The receiver further comprises a feedback loop in the Rx-chain, said regulating means arranged for providing a higher or a lower gain setting wherein the feedback loop comprises an AGC Multilevel threshold detector Unit, AMU. The AMU comprises at least one Low Multilevel Threshold Detector, LMTD, and wherein said LMTD comprises at least two threshold detectors. Each threshold detector has an associated low threshold level and detection interval. The length of each detection interval is shorter the lower the low threshold level is arranged to be set. The higher gain setting is arranged to be initiated through the feedback loop when the absolute level of an AGC input signal has been below at least one of the low threshold levels during the entire detection interval associated with that low threshold level.

The object is still further achieved by providing a method to adjust gain in a receiver comprising an input end, an Rx-chain with at least one regulating means and an output end. The receiver further comprises a feedback loop in the Rx-chain, said regulating means providing a higher or a lower gain setting wherein the feedback loop comprises an AGC Multilevel threshold detector Unit, AMU. The AMU comprises at least one Low Multilevel Threshold Detector, LMTD and wherein said LMTD comprises at least two threshold detectors. Each threshold detector has an associated low threshold level and detection interval. The length of each detection interval is shorter the lower the low threshold level is set. The higher gain setting is initiated through the feedback loop when a low threshold level has been detected by the absolute level of an AGC input signal being below at least one of the low threshold levels during the entire detection interval associated with that low threshold level.

One advantage of the invention is an improved utilization of the dynamic range of the receiver by an improved solution for low threshold level detection that will allow the gain to be maximized during a longer part of the total receiver operating time without increasing the number of AGC transitions. This will improve the performance of the receiver in terms of e.g. a better signal to noise ratio without increasing distortions due to AGC transitions.

Further advantages are achieved by implementing one or several of the features of the dependent claims which will be explained below.

DETAILED DESCRIPTION

The invention will now be described in detail with reference to the drawings.

The invention can be implemented on any analogue or analogue/digital receiver. An input signal $s_{in}$ to the receiver can be a low frequency audio signal or a single or multi carrier signal used in a communications system. Henceforth in the description the invention will be exemplified with an analogue/digital receiver as will be described in FIG. 4. However this is only one possible embodiment of the invention when using one attenuator. More than one attenuator can also be used as will be explained below.

Figure 4:
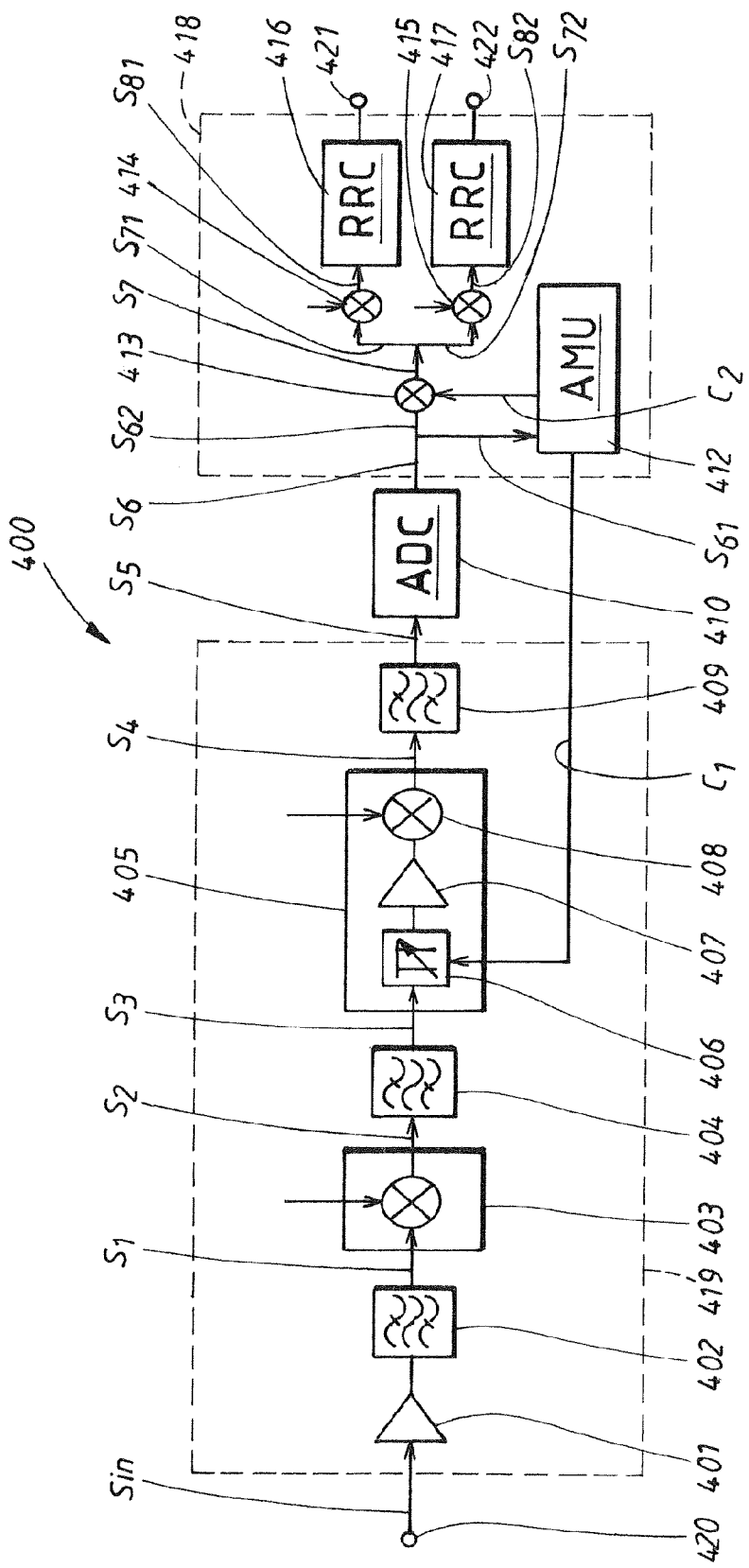
FIG. 4 schematically shows an example of a block diagram of a receiver with an AMU according to the invention.

FIG. 4 shows a receiver 400 with an analogue input signal $s_{in}$ entering at an input end 420. The example of FIG. 4 shows a single carrier receiver for a telecommunication application and the input signal is an RF (Radio Frequency) signal. The input signal is in this example modulated by an established modulation technique called IQ-modulation, where "I" represents the "in-phase" component of the signal and "Q" represents the "quadrature" component of the signal. As this technique is well known to the skilled person, it is not further explained here. The input signal $s_{in}$ is amplified in a first amplifier 401 and then passed through a first band pass filter 402 limiting the frequency to the RF range and producing as an output a first mixer input signal $s_1$ fed to a first mixer 403. The first mixer outputs a first mixer output signal $S_2$ at a first intermediate frequency which is passed through a second band pass filter 404 producing as an output a first attenuator input signal $s_3$ fed to a gain control unit 405. In the gain control unit the signal is first attenuated in a first attenuator 406, then amplified in a second amplifier 407 and finally passed through a second mixer 408 to bring down the frequency of a gain control output signal $S_4$ of the gain control unit 405 to a second intermediate frequency. The gain control output signal $S_4$ is fed to a third band pass filter 409, the output of which is an analogue output signal $s_5$ limited to the second intermediate frequency and fed to an Analogue Digital Converter (ADC), 410.

The first amplifier 401, the first band pass filter 402, the first mixer 403, the second band pass filter 404, the gain control unit 405 and the third band pass filter 409 are all parts of an analogue part 419. The output of the ADC is a digital input signal $S_6$ which is divided in two paths, an AGC input signal $S_{61}$ fed to an AGC Multilevel threshold detector Unit (AMU), 412, and an AGC compensation unit input signal $S_{62}$ fed to an AGC compensation unit 413. The AGC compensation unit has an input end, an output end and an input for receiving a second control signal $c_2$ as described below.

According to the invention, an AMU is provided as well as a receiver comprising the AMU, a communication system comprising the receiver and a method to adjust the gain in the receiver. A basic idea of the invention is that the time for the low to high gain transition can be minimized by having an AMU with at least two threshold detectors each with an associated low threshold level and detection interval to measure the power level of a received signal with high peak to average ratio properties in a more efficient way. The AMU and the measuring principle will be described more in detail in association with FIG. 6.

The AMU, generates a first control signal $c_1$ to the first attenuator 406 and the second control signal $c_2$ to the AGC compensation unit, 413. The AGC compensation unit input signal $S_{62}$ is fed to the input end of the AGC compensation unit 413 which introduces an increase or decrease of a gain to the AGC compensation unit input signal $S_{62}$ based on the information in the second control signal $c_2$. The AGC compensation unit output signal $s_7$ from the output end of the AGC compensation unit is divided in two paths, a first path $S_{71}$ and a second path $S_{72}$, the first path $S_{71}$ being connected to a first mixer stage 414 and the second path being connected to second mixer stage 415. The mixer stages are bringing down the digital intermediate frequency to baseband frequency and the signals in the mixer stages 414, 415 are phase shifted 90° in the case of IQ demodulation, used in this example.

A first mixer stage output signal $S_{81}$ from the first mixer stage is fed to a first channel filter (RRC), 416, and a second mixer stage output signal $S_{82}$ from the second mixer stage is fed to a second channel filter (RRC), 417. The mixer stages 414, 415 and RRCs 416, 417 each have an input end and an output end. RRC stands for Root Raised Cosine and defines the type of filter used. The RRC filters and the digital mixer stages are part of the IQ-demodulator producing the In-phase part (I) of the modulated signal from the first RRC filter and the Quadrature part (Q) from the second RRC filter. Other types of demodulators can also be used.

The output end of the first mixer stage is connected to the input end of the first channel filter, RRC, 416, and the output end of the second mixer stage is connected to the input end of the second channel filter, RRC, 417. The input ends of all the mixer stages are arranged to receive the AGC compensation unit output signal $s_7$ and the RRCs are arranged to produce the In-phase part (I) of the modulated signal at the output end 421 of the RRC 416 and the Quadrature part (Q) of the modulated signal at the output end 422 of the RRC 417. There are two mixer stages and two RRC filters for each carrier wave. In this example there is only one carrier wave and thus two mixer stages and two RRC filters. For a three carrier wave signal, six mixer stages and six RRC filters are required. A common AGC compensation unit is feeding all mixer stages. The output end of the receiver thus comprises the output ends 421/422 of the RRCs in case IQ-demodulation is used. In the general case, the output end of the receiver is the output end/s of the demodulator in case a demodulator is used. If a demodulator is not used, the output end of the receiver is the output end of the AGC compensation unit 413.

The components; AGC compensation unit, AMU, mixer stages and RRC filters are all parts of a digital part 418 of the receiver. The Rx-chain is defined as all analogue components, the ADC and all digital components coupled in series in the receiver. The demodulator is here counted as one digital component coupled in series with the AGC compensation unit and comprising the mixer stages and channel filters. The AMU unit is included in a feedback loop of the RX-chain and receives an input from the Rx-chain and delivers an output to the Rx-chain.

The Rx-chain of the receiver in the embodiment of FIG. 4, and also FIG. 7 as will be described below, comprises the analogue part and the digital part, the analogue part is arranged to receive the analogue input signal $s_{in}$ at the input end of the receiver, the ADC being connected between the analogue and the digital part converting the analogue output signal $s_6$ from the analogue part to the digital input signal $s_6$ to the digital part, the digital part further comprising the AMU, 412, the AGC compensation unit 413 and a demodulator. The AMU is adapted to produce the first control signal $c_1$ connected to the first attenuator 406 in the analogue part of the Rx-chain and the second control signal $c_2$ being arranged to be connected to the AGC compensation unit 413, the control signals being arranged to inform the first attenuator, 406, and the AGC compensation unit 413 when the absolute value level of the AGC input signal $s_{61}$, being a path of the $s_6$ signal, has been below anyone of the low threshold levels during the entire detection interval associated with that low threshold level. The threshold level detection principle will be described in association with FIG. 5 using analogue PAR-signals. The $s_{61}$ signal is the digital equivalence to the PAR-signals of FIG. 5 and the same detection principle is used, but now in the digital domain.

The analogue part of the Rx-chain comprises following components counted in the direction from the input end 420, the components all having an input end and an output end, and being connected in series:
the first amplifier, 401,
the first band pass filter, 402,
the first mixer, 403,
the second band pass filter, 404,
the first attenuator, 406,
the second amplifier, 407,
the second mixer, 408,
the third band pass filter, 409, the third band pass filter being connected to
the Analogue Digital Converter, ADC, 410.

Figure 5A:
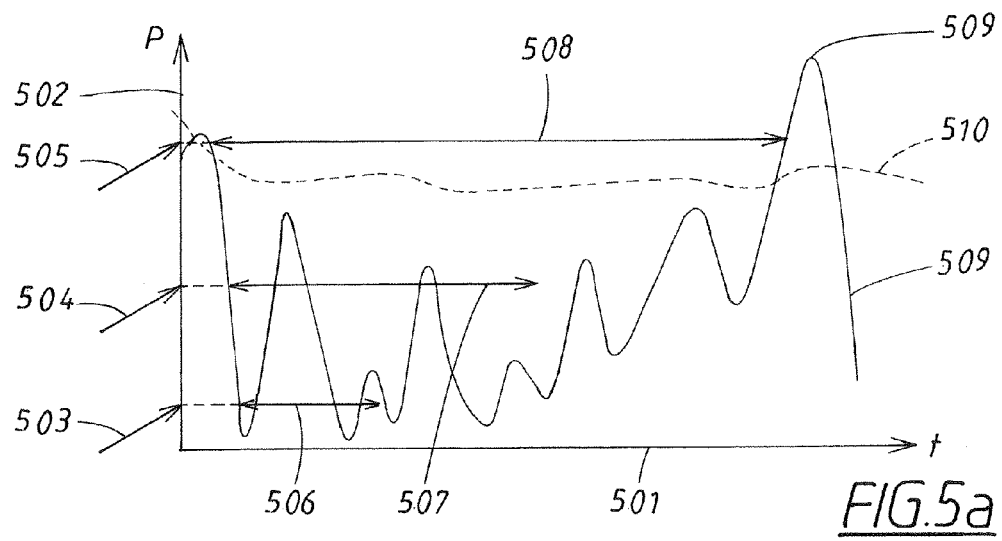
FIG. 5a shows a diagram of a low threshold level detection principle according to the invention.

By having several low threshold levels and shorter detection intervals for lower threshold levels the power of the received signal along an Rx-chain can be quickly estimated as will be explained with reference to FIG. 5a, showing the detection principle of the invention. The shorter detection intervals for lower signal levels can be used since the probability for a peak is higher for a lower threshold. The higher threshold levels are still necessary for detection of signals with a high signal level and a low peak to average ratio. The length of a detection interval for a certain low threshold level can in an embodiment be selected such that the probability for low threshold level detection will be equal for each low threshold level with its associated detection interval. To select a higher gain setting the signal power should be below the low threshold level during the entire detection interval for that low threshold level. The higher gain setting can be achieved by increasing the gain of e.g. amplifier 407 or by decreasing the attenuation of the first attenuator 406 as illustrated in FIG. 4. If any of the different low threshold level detection criteria's has been triggered the higher gain setting will be initiated.

FIG. 5a shows a diagram with time t on a horizontal axis 501 and signal power P on a vertical axis 502 with three low threshold levels, level 1, 505, level 2, 504, and level 3, 503, and their associated detection intervals, detection interval 1, 508, detection interval 2, 507 and detection interval 3, 506. This embodiment of the invention includes three low threshold levels with associated detection intervals. The detection intervals become shorter for lower threshold levels. The invention can however be implemented with in principle any number of low threshold levels above one, with associated detection intervals. FIG. 5*a* further shows a high PAR signal 509 and low PAR signal 510. In the example of FIG. 5*a*, a low threshold level will be detected for both the high and low PAR signal at the threshold level 1, 505, after the long detection interval 1, 508.

Figure 5B:
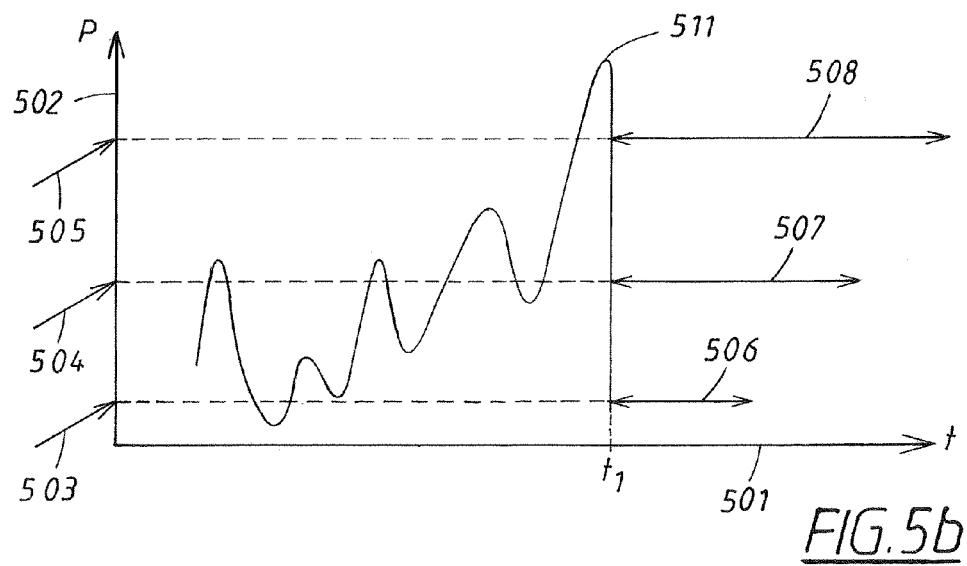
FIG. 5b schematically illustrates an example of operation of the inventive detection principle.

FIG. 5*b*, with time t on a horizontal axis 501 and power P on a vertical axis 502, illustrates a typical situation in e.g. a GSM system with a high PAR signal 511. The example of FIG. 5*b* uses the same threshold levels and detection intervals as in FIG. 5*a*. When the signal power suddenly drops at time t1, low threshold level detection can be made already at the threshold level 3, 503, with the lowest threshold level after the shortest detection interval 3, 506. This means that the higher gain setting can be achieved earlier and the receiver can work with a higher gain during a longer part of total receiver operating time thus utilizing the dynamic range of the receiver better. By using a higher gain setting the components in the receiver are able to work within their optimal dynamic working range thus improving the performance of the receiver leading to e.g. an improved signal to noise ratio.

Instead of using an attenuator as a regulating means for the AMU to regulate the signal level of the receiver an existing or additional amplifier can be used by the AMU as the regulating means for regulating the signal level of the receiver. The regulation of the signal level will in this embodiment of the invention be implemented by increasing and decreasing the gain of the amplifier. The regulating means for implementing a decrease in signal level, also called a change in gain setting, can thus be either an attenuator or an amplifier. In the embodiment of FIG. 4 the regulating means comprises one attenuator. An alternative to this is that the regulating means comprises one of the existing amplifiers or an additional amplifier used instead of the first attenuator, 406.

In summary, the receiver 400 thus comprises the input end 420, an Rx-chain with at least one regulating means (401, 407, 406) and the output end 421/422, the receiver further comprises an AGC Multilevel threshold detector Unit, AMU, 412 included in a feedback loop in the Rx-chain and being an improved AGC unit 107. The receiver thus comprises the feedback loop in the Rx-chain and the feedback loop comprises the AMU.

Figure 1:
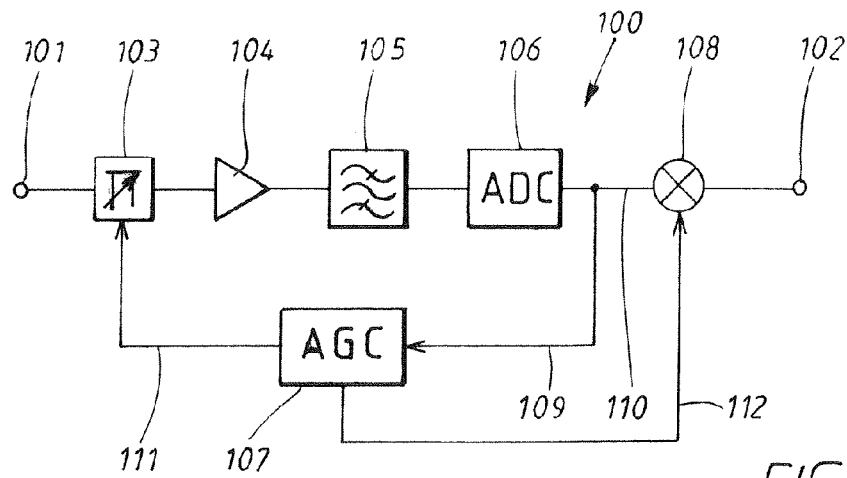
FIG. 1 shows a block diagram of a receiver using AGC according to prior art.
Figure 2:
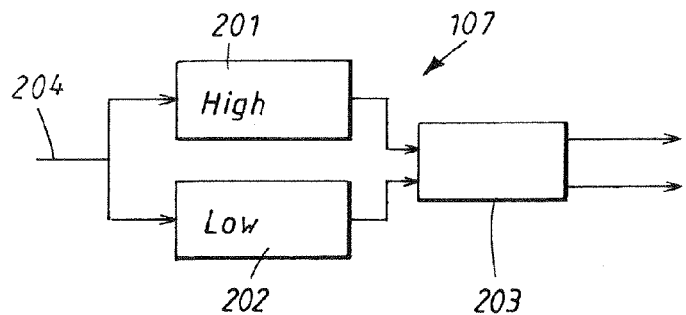
FIG. 2 shows a block diagram of a prior art Automatic Gain Control (AGC) unit.
Figure 3:
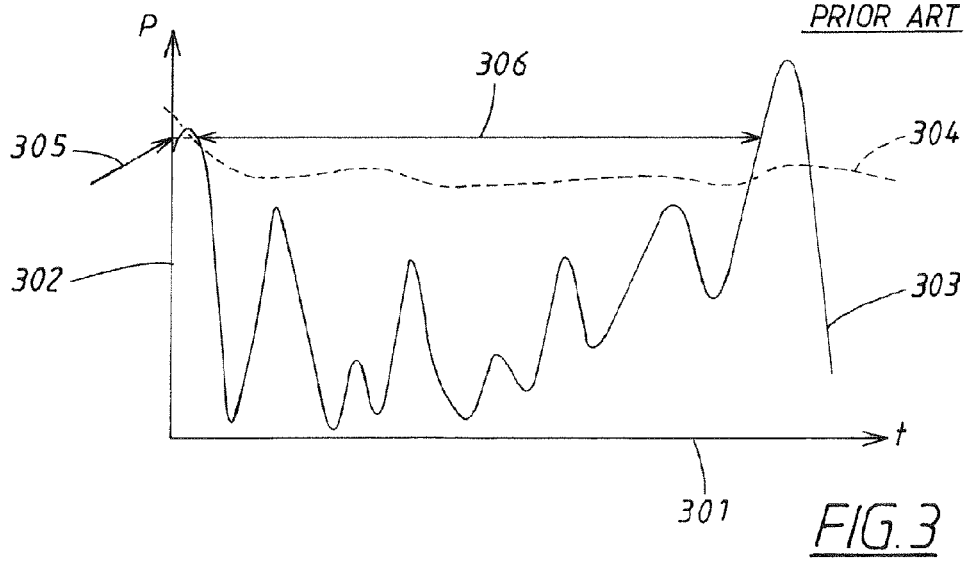
FIG. 3 shows a diagram of a prior art low threshold level detection principle.
Figure 6:
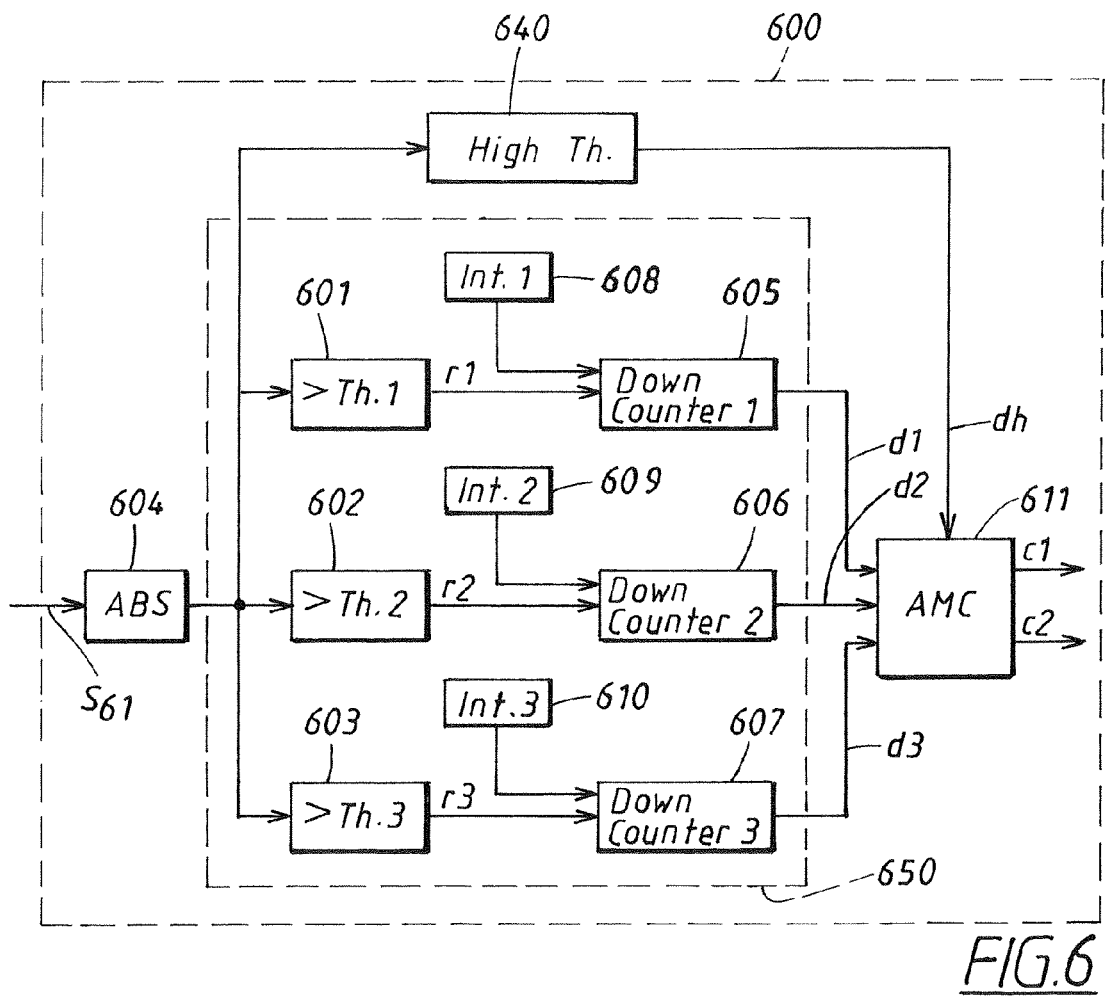
FIG. 6 schematically shows a Low Multilevel Threshold Detector (LMTD) according to an embodiment of the invention.

The AMU 600 comprising at least one Low Multilevel Threshold Detector (LMTD), 650, according to the invention will now be described with reference to FIG. 6. The absolute value of the AGC input signal $S_{61}$ is fed to a high threshold detector 640 for detection of a high threshold level and to the threshold detectors of the LMTD, 650. Each threshold detector is arranged for detection of a low threshold level. The high threshold detector 640 can be any type of standard detector such as the high threshold detector 201 shown in FIG. 2 and well known to the skilled person. The threshold detectors 601-603 can also be any type of standard detector well known to the skilled person.

In prior art solutions the LMTD comprises only one low threshold detector 202 with an associated low threshold level 305 and detection interval 306. In the prior art solution the AGC unit is adapted to initiate a higher gain setting of the receiver when an absolute level of an AGC input signal $S_{61}$ has been below the only low threshold level during the entire detection interval 306.

Now turning again to the invention the Rx-chain comprises regulating means for arranging a higher or lower gain setting as will be explained further and the LMTD 650 comprises at least one additional threshold detector, each detector having an associated low threshold level and detection interval. The detection interval becomes shorter the lower the low threshold level is arranged to be set. The higher gain setting is arranged to be initiated through the feedback loop when the absolute level of the AGC input signal $S_{61}$ has been below at least one of the low threshold levels during the entire detection interval associated with that low threshold level.

The absolute value of the AGC input signal, $S_{61}$, is calculated in an absolute signal level detector ABS, 604, by conventional means well known to the skilled person. The ABS, 604, arranged to receive the AGC input signal, $S_{61}$, at an input end and arranged to output an absolute value of the AGC input signal, being proportional to the signal power, at an output end, the output end being connected to each threshold detector in the LMTD and the high threshold detector associated with a high threshold level.

The LMTD 650 will be described with an embodiment having three low threshold levels; level 1, 505, level 2, 504 and level 3, 503, and their associated detection intervals as described in association with FIGS. 5*a* and 5*b*. The absolute value of the AGC input signal $s_{61}$ fed to the LMTD is divided in three paths and fed to three threshold detectors, a level 1 detector 601, a level 2 detector 602 and a level 3 detector 603. As an example, the low threshold levels 1 to 3 could be set to a level of 1, 3 and 6 dB below the level of the high threshold level detector plus an additional decrease of the level corresponding to the AGC attenuation step size, see also FIG. 9. The level 1 detector thus has the highest absolute value and the level three detector the lowest. The low threshold level for each threshold detector can be arranged to be stored in the respective threshold detector. The length of detection intervals should in this case preferably be selected in such a way that the probability for a low threshold level detection should be substantially the same for each low threshold level. Thus shorter detection intervals can be chosen for lower threshold levels as the probability that the signal exceeds these lower levels are higher. It is however not a necessary feature of the invention that the detection probability is the same for each low threshold level but the detection interval should be shorter the lower the low threshold level is set. This means that the detection intervals should have the following time relations: detection interval 1>detection interval 2>detection interval 3. Detection interval 1 is associated with the low threshold level 1, detection interval 2 with the low threshold level 2 and detection interval 3 with the low threshold level 3. For quicker decisions more threshold detectors could be added with even shorter detection intervals. In the general case, low threshold level n with threshold detector n thus has a detection interval n where n is ranging from 1 to N, n being integer values. In the example described N=3. The low threshold level becomes lower and the detection interval shorter for increasing values of n.

The detection probability at different threshold levels can be calculated with different mathematical methods. One possibility is to calculate the well known Complementary Cumulative Distribution Function (CCDF) for an assumed worst case PAR-signal. The assumed worst case PAR-signal received by the communication system is a Rayleigh distributed signal. The CCDF is a statistical function showing the percentage of time that the PAR-signal is equal to or exceeds different power levels. The power levels are related to the average PAR-signal level. The percentage of the time that the PAR-signal exceeds a certain power level decreases rapidly with power level according to the CCDF-curve. The probability for a PAR-signal to be above certain power levels can thus be expressed with the CCDF. The probability to exceed a certain level is also a function of time. The longer detection interval, the higher the probability will be to exceed a certain level. By using longer detection intervals for higher power levels the same probability to exceed a certain level can be achieved for a high power level as a low power level using a short detection interval. The detailed calculation method will be described in association with FIGS. 9 and 10.

An embodiment of the LMTD comprises n threshold detectors as described above, and a down counter n for each low threshold level. Each of these components has an input end and an output end. The LMTD further comprises n interval units, 608-610, with an output end. The threshold detectors, down counters and interval units being arranged in n branches, n being an integer ranging from 1 to N, each branch comprising:

the threshold detector n (601-603), associated with low threshold level n and detection interval n, being arranged to receive the absolute value of the AGC input signal $S_{61}$ at the input end and the output end being connected to the down counter n (605-607), the output end of the down counter being connected to the AGC Multilevel Control (AMC), 611, and the interval unit n (608-610) being arranged to store the detection interval and the output end of which is connected to the input end of the down counter n wherein the low threshold level becomes lower and the detection interval shorter for increasing values of n.

Turning again to FIG. 6 this will be further explained. The down counter is thus loaded with the detection interval n associated with the low threshold level n. In the embodiment of FIG. 6, N=3. The down counter 1, 605, is loaded with the detection interval 1, the down counter 2, 606, is loaded with the detection interval 2 and the down counter 3, 607, is loaded with the detection interval 3. The detection interval 1 is arranged to be loaded in interval unit 1 designated 608, detection interval 2 is arranged to be loaded in interval unit 2, designated 609 and detection interval 3 is arranged to be loaded in interval unit 3 designated 610 in FIG. 6. When the absolute value of the AGC input signal, $s_{61}$, is above level 1, the level 1 detector will send a reload pulse $r_1$ to the down counter 1 which will set the down counter 1 to the detection interval 1. When the absolute value of the AGC input signal, $s_{61}$, is below the level 1 there will be no $r_1$ pulse generated and the down counter 1 will start counting down from the set value, being the detection interval 1.

As long as the absolute value of the AGC input signal, $s_{61}$, is below the level 1 the down counter will continue to count down and will eventually reach zero when the absolute value of the AGC input signal, $s_{61}$, has been below the level 1 during the whole detection interval 1. The down counter will now generate a first detection signal $d_1$ to the AMC, 611, to inform that a low threshold at level 1 has been detected. The down counter 605 is reloaded with the detection interval 1 and a new detection cycle is started. The level 2 and the level 3 detector is working according to the same principle and will generate a second detection signal $d_2$ from the level 2 detector and a third detection signal $d_3$ from the level 3 detector informing the AMC that a low threshold at level 2 respectively level 3 has been detected. This down counter function can then be defined in general terms as follows:

the threshold detector n, 601-603, is arranged to generate a reload pulse r to the down counter initiating the down counter to be loaded with the detection interval stored in interval unit n when the absolute value of the AGC input signal at the input end of a threshold detector n is above the threshold level and the threshold detector is arranged not to generate a reload pulse r to the down counter, the down counter being loaded with the detection interval n, when the absolute value of the AGC input signal at the input end of a threshold detector n is below the threshold level, and the down counter being arranged to count down as long as there is no reload pulse at the input end of the down counter and the down counter further being arranged to generate a detection signal dn to the AMC when the down counter reaches zero.

Thus the AMC is arranged to receive a detection signal dn from the down counters for each threshold level n, n ranging from 1 to N, when a low threshold level has been detected and a high level detection signal, $d_h$, when a high threshold level has been detected. The AMC will further be arranged to generate the first and the second control signals $c_1$ and $c_2$.

In an embodiment of the invention the AMC is arranged to receive detection signals from the LMTD and the high threshold detector at an input end and arranged to output the first control signal $c_1$ and the second control signal $c_2$ at an output end at detection of a low threshold level n or the high threshold level. These control signals thus comprises information of either that one of the low threshold levels has been detected or that the high threshold level has been detected. The first control signal is arranged to be connected to the first attenuator 406 which will cause the attenuator to decrease the attenuation with a predetermined amount to a low attenuation level when the first control signal $c_1$ comprises information that a low threshold level has been detected, thus achieving a higher gain setting.

Alternatively the higher gain setting described in association with FIG. 5a can be achieved by increasing the gain of the amplifier 407 or an additional amplifier. This alternative solution is not shown in FIG. 6 and henceforth in the description the invention is exemplified with adjusting the attenuation instead of adjusting the gain of an amplifier. The attenuator and amplifiers are examples of regulating means for arranging a higher or lower gain setting. The attenuator comprises means for arranging the higher gain setting when the first control signal is received comprising information that a low threshold level has been detected. The means for a higher gain setting of the attenuator can e.g. be different attenuation networks, as e.g. a π-network, that are switched into the Rx-chain depending on the information in the $c_1$ signal. A π-network consists of three impedances each having two ends and connected to form the approximate shape of the symbol π and is well known to the skilled person. When for example a higher gain setting shall be accomplished a lower attenuation is switched into the Rx-chain. The attenuator also includes switching means, as e.g. PIN-diode switches, to switch between the different attenuation networks. The decrease of attenuation will be the same irrespective of which of the threshold detectors that has been triggered. However, several attenuation levels can be accomplished by using several LMTD's or several sets of threshold levels as will be described below. If additional first control signals from the AMC are received by the attenuator indicating that a further low threshold level has been detected this will not further effect the attenuator level but it will be kept at the low attenuation level until the first control signal comprises information that a high threshold level has been detected.

When the attenuator receives the first control signal comprising the detection of a high threshold level the attenuator will be set to high attenuation. The high attenuation will be kept until the first control signal comprises information that a low threshold level has been detected. The attenuator will also comprise means for arranging a lower gain setting when the first control signal is received and comprising information that a high threshold level has been detected. The means for a lower gain setting of the attenuator can e.g. be different attenuation networks, as e.g. a π-network, that are switched into the Rx-chain depending on the information in the $c_1$ signal. When for example a lower gain setting shall be accomplished a higher attenuation is switched into the Rx-chain. The high and low attenuation levels can be stored in the regulating means or stored in the AMU 412 and transferred to the regulating means via the first control signal. When the higher or lower gain setting is accomplished with an amplifier, the amplifier will include means for arranging a higher or lower gain setting.

As will be described in association with FIG. 7 additional attenuators and amplifiers can be implemented in the Rx-chain which means that the regulating means for arranging a higher or lower gain setting comprises:

the first attenuator or the first attenuator and at least one additional attenuator comprised in the Rx-chain the first and/or second amplifier or the first and/or second amplifier and at least one additional amplifier comprised in the Rx-chain.

The attenuators and amplifiers are arranged to respond to the first control signal $c_1$ as follows:

one or several of the attenuators is/are arranged to decrease the attenuation when the first control signal $c_1$ contains information that a low threshold level has been detected or arranged to increase the attenuation when the first control signal $c_1$ contains information that the high threshold level has been detected one or several of the amplifiers is/are arranged to increase the gain when the first control signal $c_1$ contains information that a low threshold level has been detected or arranged to decrease the gain when the first control signal $c_1$ contains information that the high threshold level has been detected.

The second control signal, $c_2$, comprising the same information as the first control signal, is fed to the AGC compensation unit which will cause the AGC compensation unit to compensate for the gain setting in the attenuator in order to control the signal level in the receiver such that the AGC gain setting should not influence the total gain in the Rx-chain. This means that when the second control signal comprises information that a low threshold level has been detected the AGC compensation unit will decrease the gain of the AGC compensation unit corresponding to the attenuation decrease in the attenuator. When the second control signal comprises information that the high threshold level has been detected the AGC compensation unit will increase the gain of the AGC compensation unit corresponding to the attenuation increase in the attenuator. This corresponding gain decrease and gain increase can e.g. be stored in the AGC compensation unit or stored in the AMU 412 and transferred to the AGC compensation unit via the second control signal. The gain variations in the AGC compensation unit can be accomplished by either varying attenuation or amplification in the AGC compensation unit.

In an alternative embodiment of the invention, the attenuation of the attenuator can be decreased in several steps. This is accomplished by the AMU comprising q LMTD's in parallel, q being an integer between 1 to Q. Each LMTD is configured with different sets of low threshold levels, 1 to Q, and corresponding detection intervals, the output end of each down counter in the LMTDs being connected to the AMC and the first and second control signals being arranged to be generated from the AMC and arranged to comprise information of from which LMTD a low threshold level has been detected. When Q=3 there are thus three sets of threshold levels and detection intervals, a first, second and third set corresponding to the first, second and third LMTD. When a low threshold level is detected in this embodiment the control signals $c_1$ and $c_2$ will thus also include information from which LMTD the low threshold level detection originates. The attenuator will include means for setting the attenuation to a level being characteristic for each LMTD. In the case with three LMTDs there will thus be possible to set the attenuation to one of three different attentions depending of from which LMTD the threshold detection origins. The high threshold level detection is made in the same way as described for the embodiment with one LMTD and one set of low threshold levels. In alternative solutions where an amplifier is used instead of an attenuator to achieve the higher or lower gain setting, as described above, the amplifier comprises means for setting the amplification to a level being characteristic for each LMTD.

In a further embodiment the different sets of low threshold levels are loaded in the same LMTD during different time slots. In the same example as above with three sets of low threshold levels and detection intervals, a first set of low threshold levels and detection intervals are loaded during a first time slot, a second set during a second time slot and a third set during a third time slot. This means that the threshold detectors, and down counters are continuously reloaded with new sets of low threshold levels and detection intervals. This can be accomplished by any conventional means as e.g. adding a control unit to the AMU continuously reloading the LMTD with new sets of low threshold levels and detection intervals at a certain frequency. The separate control unit is included in the AMU and is connected to each threshold detector, down counter and interval unit. The control unit comprises reload information as e.g. the sets of low threshold levels and detection intervals as well as reload frequency. The first and second control signals will in this further embodiment include information of from which set of low threshold levels the low threshold level detection originates. The attenuator will in the same way as described above for the alternative embodiment with q LMTDs in parallel now be able to set the attenuation to three different attenuations depending on from which set of low threshold levels the threshold detection origins. The high threshold level detection is made in the same way as described for the embodiment with one LMTD and one set of low threshold levels. In alternative solutions where an amplifier is used instead of an attenuator to achieve the higher or lower gain setting, as described above, the amplifier comprises means for setting the amplification to a level being characteristic for each LMTD.

Figure 7:
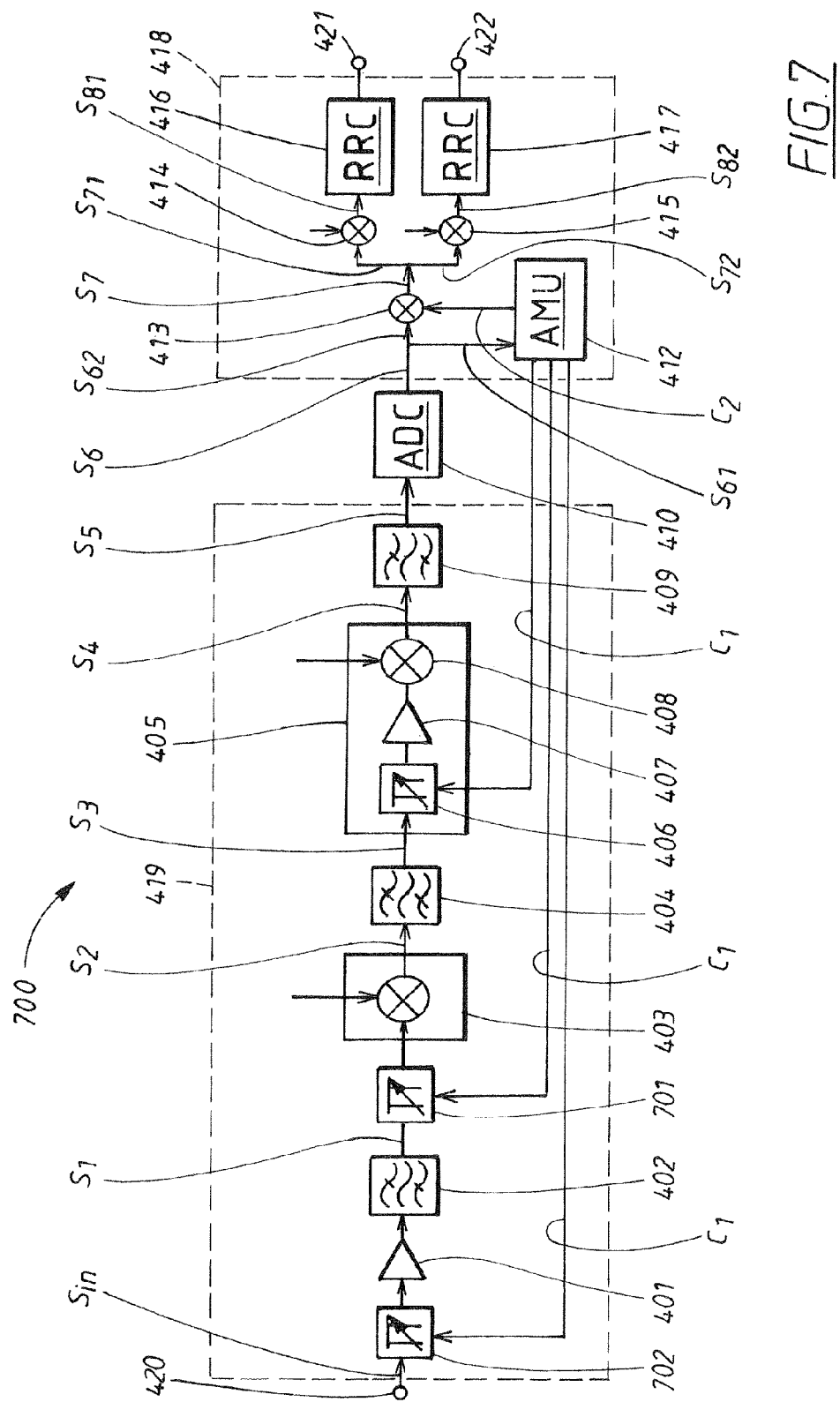
FIG. 7 shows a block diagram of an embodiment of the invention using several attenuators.

The invention can also be implemented with more than one attenuator as mentioned above. This further embodiment of a receiver 700 shall be described with reference to FIG. 7. The configuration of FIG. 7 is the same as for FIG. 4 with the following additions:

a second attenuator 701 is added between the first band pass filter 402 and the first mixer 403 a third attenuator 702 is added in front of the first amplifier 401 the first control signal $c_1$ is divided in three paths and fed to each of the attenuators FIG. 7 also shows the components of the Rx-chain included in FIG. 4, i.e.:
- the first amplifier, 401,
- the first band pass filter, 402,
- the first mixer, 403,
- the second band pass filter, 404,
- the first attenuator, 406,
- the second amplifier, 407,
- the second mixer 408,
- the third band pass filter, 409,
- the Analogue Digital Converter, 410,
- the AGC compensation unit, 413 and
- the demodulator comprising the two mixer stages, 414/415, and the two channel filters, RRC, 416/417.

FIG. 7 also shows the AMU, 412, and the signals $s_{in}$ and $S_1$ to $s_{82}$ as described in association with FIG. 4.

The receiver 700 of FIG. 7 also comprises input, 420, and output, 421/422, ends as defined in association with FIG. 4.

Other configurations with different numbers and locations of attenuators and amplifiers are also possible within the scope of the invention.

The inventive receiver can use IQ-demodulators as well as other demodulators.

Each attenuator can be set to a low or high level according to the same principles as describe above for the embodiment with one LMTD and one set of low threshold levels. In case of embodiments with more than one LMTD or more than one set of low threshold levels each attenuator can be set at as many levels as there are LMTDs or set of low threshold levels. The means for gain setting included in each regulating means can be set individually for each regulating means. In an example with two attenuators $a_1$ and $a_2$ and two LMTD's, $l_1$ and $l_2$, a low signal detection from $l_1$ can cause the gain setting means of $a_1$ to decrease attenuation of $a_1$ with $d_1$ and the gain setting means of $a_2$ to decrease attenuation of $a_2$ with $d_2$. A low signal level detection from $l_2$ can correspondingly cause an attenuation decrease of $d_3$ at $a_1$ and $d_4$ at $a_2$. When amplifiers are used as regulating means the amplification adjustments of each amplifier can correspondingly be set individually for each amplifier. The $c_2$ signal is generated from the AMC in the same way as described for the different embodiments above. The gain setting means included in the regulating means can in this embodiment comprise as many attenuation networks as there are LMTDs or sets of threshold levels. An attenuation network will be dedicated to each LMTD or sets of threshold levels and will be switched into the Rx-chain in response to the information in the $c_1$ signal.

As described above the higher and lower gain settings can also be achieved by using an existing amplifier in the receiver or an additional amplifier dedicated only for this purpose.

Embodiments with more than one LMTD or more than one set of low threshold levels can be combined with the embodiments having one or several regulating means.

When more than one set of low threshold levels and detection intervals are used and when combined with embodiments with more than one regulating means, then at least one attenuator or amplifier, comprising means for arranging a higher or lower gain setting being characteristic for each LMTD, is/are arranged to receive the first control signal $c_1$ thus enabling each attenuator or amplifier having as many attenuation/gain levels as there are LMTDs. The AGC compensation unit is in this implementation of the invention arranged to receive the second control signal $c_2$ and to compensate for the gain setting arranged to be initiated by the first control signal $c_1$.

Figure 9:
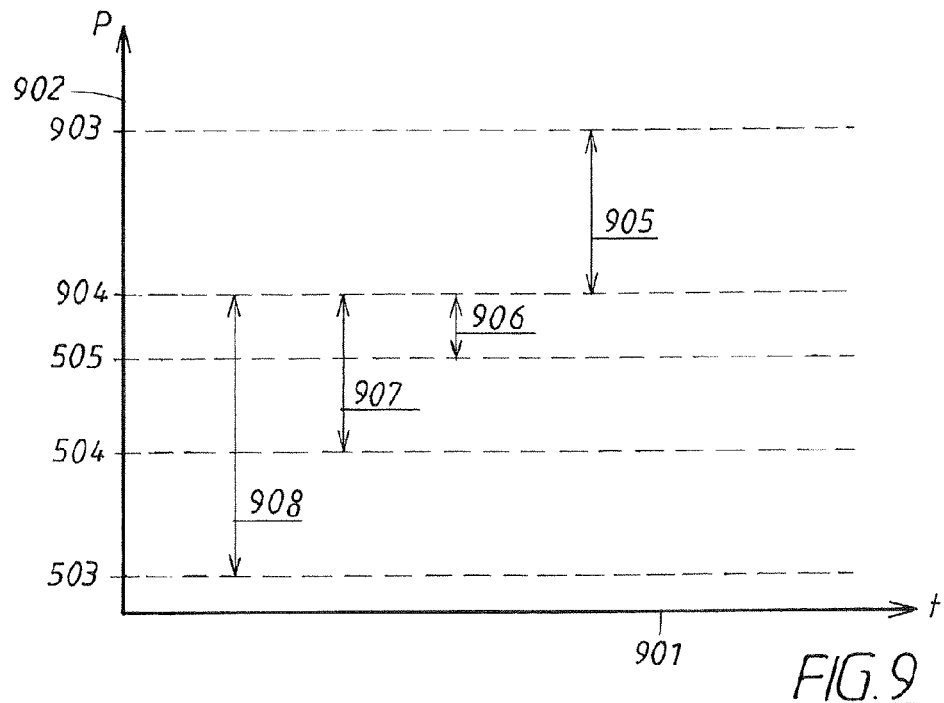
FIG. 9 schematically shows low threshold levels in relation to maximum allowed power signal level.

The detailed description of the method for calculating the probability for low threshold level detection as a function of the length of the detection interval shall now be described with reference to FIGS. 9 and 10.

The low threshold levels are normally set in relation to the attenuation step size from the maximum allowed signal power level corresponding to the high threshold level 903. This is shown in FIG. 9 having signal power on the vertical axis 902 and time on the horizontal axis 901. The attenuation step size 905 brings down the level to a maximum power level after attenuation release, called maximum power release level 904. The low threshold levels; level 1, 505, level 2, 504 and level 3, 503 are then set as back offs from the maximum power level 904. In this example level 1 has a 1 dB back off, 906, level 2 a 3 dB back off, 907, and level 3 a 6 dB back off, 908. This threshold level setting will assure that when the attenuator is released the probability for the signal to reach the maximum allowed signal level should be reasonable low. As mentioned earlier there can be several attenuation step sizes, each having a separate set of low threshold levels.

The detection probability at different threshold levels can be calculated with different mathematical methods as mentioned above. One possibility is to calculate the well known Complementary Cumulative Distribution Function (CCDF) for an assumed worst case PAR-signal. The assumed worst case PAR-signal received by the communication system is a Rayleigh distributed signal. The assumption is that for a Rayleigh distributed signal with a bandwidth, BW, of 1.28 MHz, the probability, $P_{max}$ after the attenuator release for the signal to reach the maximum allowed signal level should be 50% during a time period of, $T_{frame}$, equal to 10 ms. The number of uncorrelated periods during the time interval is given by:

$$N_{periods} = T_{frame} \cdot BW = 10 \cdot 10^{-3} \cdot 1.28 \cdot 10^6 = 12.8 \cdot 10^3$$

The probability for each uncorrelated time period is:

$$P_{period} = 1 - \sqrt[N_{periods}]{1-P\max} = 54.15 \cdot 10^{-6}$$

Figure 10:
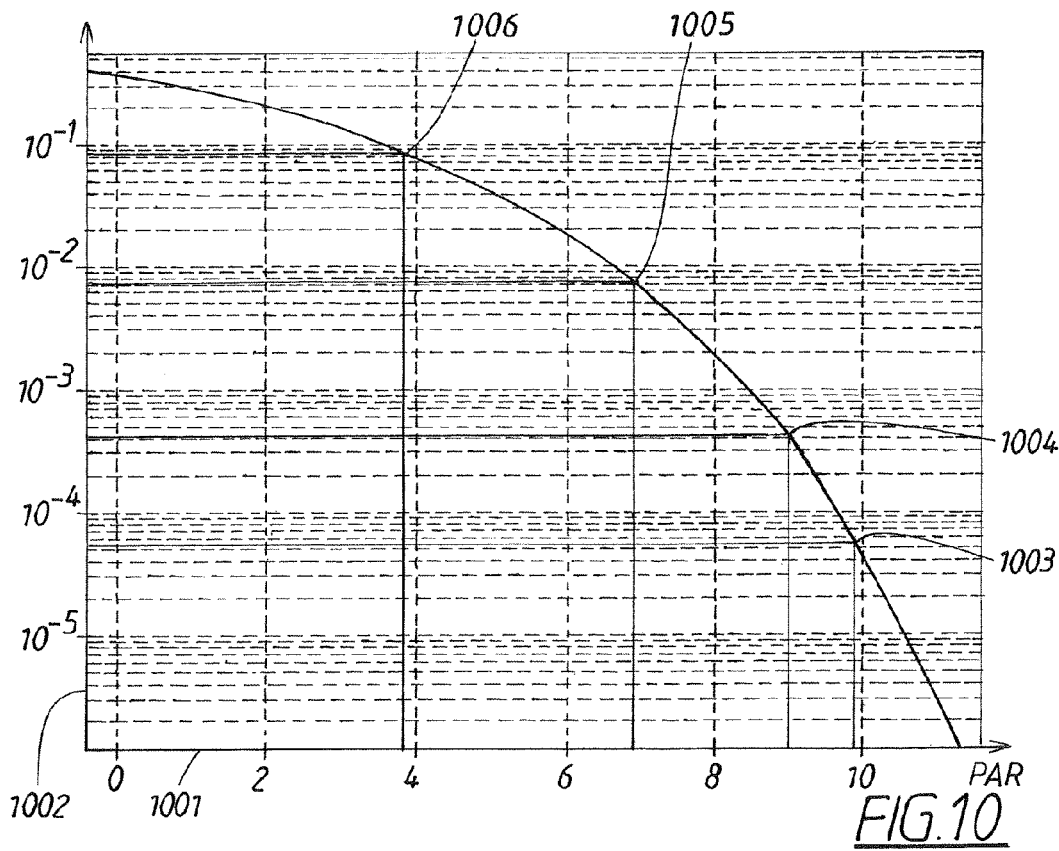
FIG. 10 shows a diagram of a Complementary Cumulative Distribution Function (CCDF).

FIG. 10 shows a diagram with the CCDF-curve giving the probability for a peak of a Rayleigh distributed signal to be above a certain level on the vertical axis 1002 in relation to the average power level in dB of the Rayleigh distributed signal, the PAR-value of the signal, on the horizontal axis 1001.

The related signal power for the PAR-signal for the $P_{period}$ for a Rayleigh distributed signal is found in FIG. 10 to be 9.9 dB, point 1003 in the diagram. The probability that the signal will be above this level thus corresponds to $P_{period} = 54.15 \cdot 10^{-6}$.

The probabilities for different back off levels, counted from point 1003, at the same average power level are summarized in the table below:

| Back off [dB] | Probability ($P_x$) |
|---|---|
| 1 | P1 = 4.16*10$^{-4}$ |
| 3 | P2 = 7.36*10$^{-3}$ |
| 6 | P3 = 0.085 |

Back off level 1 dB corresponds to point 1004, back off level 3 dB to point 1005 and back off level 6 dB to point 1006 in the diagram. The assumption is that the probability that any of the 3 threshold detectors is activated during the $T_{frame}$ period should be 50%. The probability, $P_{individual\_detector}$, for each detector is thus given by:

$$P_{individual\_detector} = 1 - \sqrt[3]{1-0.5} = 0.2$$

This means that the probability for a low threshold detection will be 20% at each low threshold level.

The time constant for each detector is given by:

$$t_x = \frac{\log(P_{individual\_detector})}{\log(1-P_x) \cdot BW}$$

The calculated time constant for each threshold should thus be:

| Threshold back off [dB] | Time constant ($t_x$) |
|---|---|
| 1 | 3.03 ms |
| 3 | 171 µs |
| 6 | 14 µs |

By choosing these time constants for the low threshold detector thresholds the probability for a release of the attenuator during a 10 ms time period should be 50% that either of the detector levels is triggered. If the attenuator is released the probability to go back to the attenuated state will also be 50% during the same period of time. This is one example of how to calculate that the probability for low threshold level detection should be the same for each threshold level. As mentioned earlier it is however not necessary that the probability is set equal for each threshold level. The probability for release can of course also be set to other values than 50% as used in the example above.

As has been described above there are many variations of the analogue part, 419, of the Rx-chain depending on type of input signal. There are however always at least one regulating means. Band pass filters, amplifiers and mixers are then added at suitable locations in the Rx-chain in response to the requirements set by the type of input signal in the actual application. The digital part of the Rx-chain, 418, normally includes the AMU, the AGC compensation unit and some type of demodulator in case the input signal is modulated. The invention has been exemplified with an analogue/digital receiver, with an analogue part, an ADC and a digital part comprising an AGC compensation unit, the AMU and a demodulator. The invention can however also be implemented as a completely analogue receiver or with a digital interface located at another location in the Rx-chain as e.g. before the demodulator i.e. with an analogue AMU and AGC compensation unit and a digital demodulator.

Further embodiments of the invention include:
a receiver arranged to receive the input signal $s_{in}$ at the input end 420, the input signal being a single carrier signal and the receiver thus a single carrier receiver,
a receiver arranged to receive the input signal $s_{in}$ at the input end 420, the input signal being a multi carrier signal and the receiver thus a multi carrier receiver,
a receiver used in a telecommunications system,
a receiver used in a telecommunication system where the telecommunication system is a GSM-, CDMA-, WCDMA or LTE-system and
a receiver being an audio receiver.

The invention further provides a communication system, as e.g. a GSM-, CDMA, WCDMA- or LTE-telecommunication system, comprising the receiver and/or the AMU according to the invention.

The invention further provides an AGC Multilevel threshold detector Unit, AMU, wherein the AMU comprises at least one Low Multilevel Threshold Detector, LMTD. Said LMTD comprises at least two threshold detectors. Each threshold detector has an associated low threshold level and detection interval. The length of the detection interval is shorter the lower the low threshold level is arranged to be set.

Figure 8:
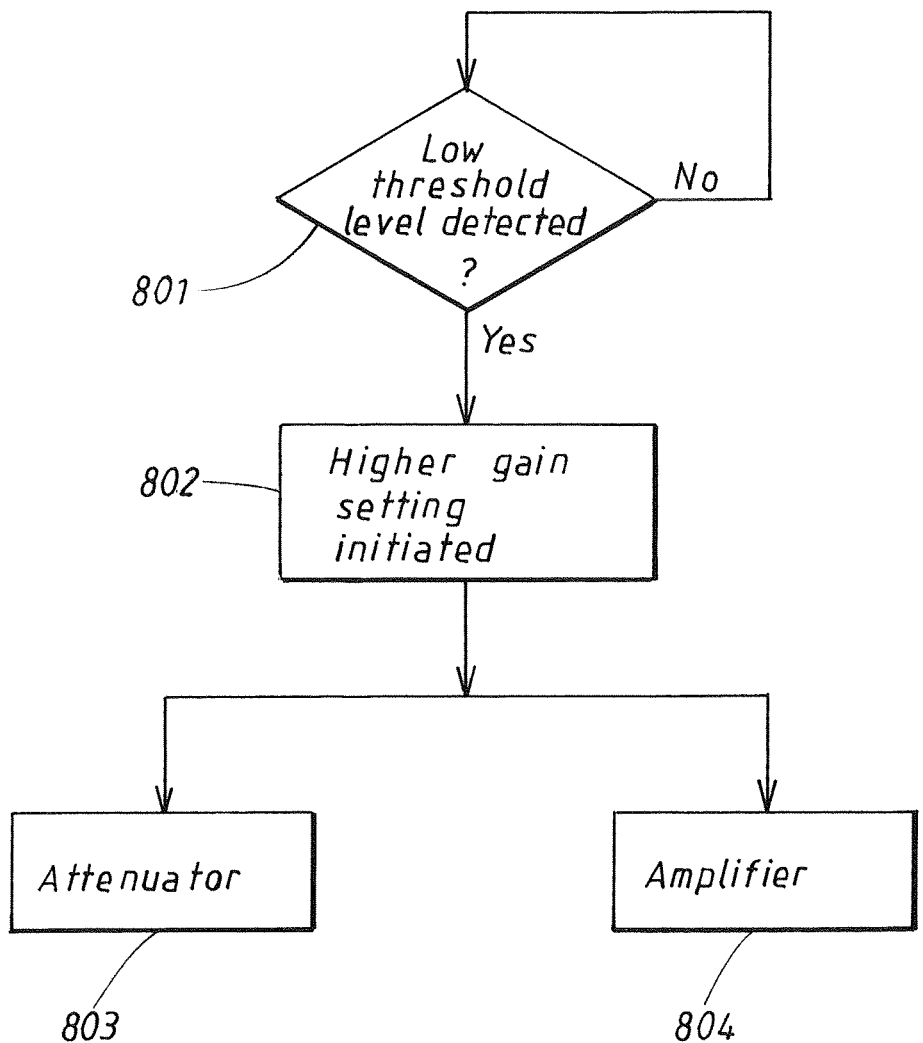
FIG. 8 schematically shows the method steps of higher gain setting according to the invention.

The invention also includes a method to adjust gain in a receiver comprising an input end 420, an Rx-chain with at least one regulating means and an output end 421/422. The receiver further comprises a feedback loop in the Rx-chain, said regulating means providing a higher or a lower gain setting wherein the feedback loop comprises an AGC Multi-level threshold detector Unit, AMU. The AMU comprises at least one Low Multilevel Threshold Detector, LMTD and wherein said LMTD comprises at least two threshold detectors. Each threshold detector has an associated low threshold level and detection interval. The length of each detection interval is shorter the lower the low threshold level is set. The higher gain setting is initiated through the feedback loop when a low threshold level has been detected by the absolute level of an AGC input signal being below at least one of the low threshold levels during the entire detection interval associated with that low threshold level. The method steps for the higher gain setting of the receiver are illustrated in FIG. 8. A higher gain setting will not be initiated as long as no low threshold levels are detected in step 1, 801. When a low threshold level has been detected by the AMU in step 1, a higher gain setting will be initiated in step 2, 802, through the first control signal $c_1$. If an attenuator is used as the means for arranging a higher gain setting, the higher gain setting is performed by an attenuator in step 3, 803. If an amplifier is used as the regulating means for arranging a higher gain setting, the higher gain setting is performed by an amplifier in step 4, 804. The details of the method are described in association with the receiver description. This part of the description also describes how a lower gain setting is arranged in case a high threshold level is detected.

The invention is not limited to the embodiments above, but may vary freely within the scope of the appended claims.

The invention claimed is:

1. A receiver comprising:
an input end,
an Rx-chain with at least one regulating device,
an output end,
a feedback loop in the Rx-chain,
said at least one regulating device being arranged for providing a higher or a lower gain setting,
the feedback loop comprises an AGC Multilevel threshold detector Unit (AMU), the AMU comprising at least one Low Multilevel Threshold Detector (LMTD), and that said LMTD comprises at least two low threshold detectors, each of the at least two low threshold detectors having an associated low threshold level and detection interval, the selectable length of each detection interval selected to be shorter the lower each corresponding low threshold level is set, the higher gain setting being arranged to be initiated through the feedback loop when the absolute level of an AGC input signal has been below at least one of the low threshold levels during the entire detection interval associated with that at least one low threshold level.

2. The receiver according to claim 1, wherein the AMU further comprises:
an Absolute detector (ABS), arranged to receive the AGC input signal at an input end and arranged to output an absolute value of the AGC input signal, being proportional to the signal power, at an output end, the output end being connected to each low threshold detector in the LMTD;
a high threshold detector associated with a high threshold level; and an AGC Multilevel Control (AMC), the AMC being arranged to receive detection signals from the LMTD and the high threshold detector at an input end and arranged to output a first control signal and a second control signal at an output end.

3. The receiver according to claim 2, where the first control signal is arranged to comprise information of detection of a low threshold level or the high threshold level, the first control signal being arranged to be connected to the regulating device for arranging a higher or lower gain setting.

4. The receiver according to claim 1, wherein the at least one regulating device for arranging a higher or lower gain setting comprises a first attenuator or the first attenuator and at least one additional attenuator comprised in the Rx-chain.

5. The receiver according to claim 1, wherein the Rx-chain comprises an analogue part and a digital part, the analogue part is arranged to receive an analogue input signal at the input end of the receiver, an Analogue Digital Converter (ADC) being connected between the analogue and the digital part arranged to convert an analogue output signal from the analogue part to a digital input signal to the digital part, the digital part further comprising the AMU and an AGC compensation unit, the AMU being adapted to produce the first control signal connected to the first attenuator in the analogue part of the Rx-chain and the second control signal being arranged to be connected to the AGC compensation unit, the control signals being arranged to inform the first attenuator and the AGC compensation unit when the absolute level of the AGC input signal, being a path of the digital input signal, has been below anyone of the low threshold levels during the entire detection interval associated with that low threshold level.

6. The receiver according to claim 5, wherein one or several of the attenuators is/are arranged to decrease the attenuation when the first control signal contains information that a low threshold level has been detected or arranged to increase the attenuation when the first control signal contains information that the high threshold level has been detected.

7. The receiver according to claim 5, wherein the digital part further comprises a demodulator.

8. The receiver according to claim 5, wherein the receiver is arranged to receive the input signal at the input end, the input signal being a single carrier signal and the receiver thus a single carrier receiver or in that the receiver is arranged to receive the input signal $s_{in}$ at the input end, the input signal being a multi carrier signal and the receiver thus a multi carrier receiver.

9. The receiver according to claim 1, wherein the at least one regulating device for arranging a higher or lower gain setting comprises a first and/or a second amplifier or the first and/or the second amplifier and at least one additional amplifier comprised in the Rx-chain.

10. The receiver according to claim 1, wherein the LMTD, comprises the at least two low threshold detectors and at least two down counters, each of these components having an input and output end, and the LMTD further comprising at least two interval units having an output end, the at least two low threshold detectors, the at least two down counters and the at least two interval units being arranged in n branches, n being an integer ranging from 1 to N, each branch comprising:
the low threshold detector n associated with low threshold level n and detection interval n, being arranged to receive the absolute value of the AGC input signal at the input end and the output end being connected to:
the down counter n, the output end of the down counter being connected to the AMC,
the interval unit n being arranged to store the detection interval and the output end of which is connected to the input end of the down counter n, and
wherein the low threshold level becomes lower and the detection interval shorter for increasing values of n.

11. The receiver according to claim 1, wherein the AMU comprises q LMTDs, q being an integer ranging from 1 to Q, being connected in parallel, each LMTD comprising different sets of low threshold levels and corresponding detection intervals, the output end of each down counter in the LMTDs being connected to the AMC and the first and second control signals being arranged to be generated from the AMC and arranged to comprise information of from which LMTD a low threshold level has been detected.

12. The receiver according to claim 1, wherein different sets of low threshold levels and detection intervals are arranged to be loaded in the same LMTD during different time slots and the at least two low threshold detectors, at least two down counters and at least two interval units are arranged to continuously be reloaded at a certain frequency with new sets of threshold levels and detection intervals by a separate control unit included in the AMU and connected to each low threshold detector, down counter and interval unit, the control unit comprising reload information.

13. The receiver according to claim 12, further comprising:
at least one attenuator or amplifier, each attenuator or amplifier configured for arranging a higher or lower gain setting being characteristic for each LMTD, each attenuator or amplifier further arranged to receive the first control signal thus enabling each attenuator or amplifier having as many attenuation/gain levels as there are LMTDs; and
an AGC compensation unit arranged to receive the second control signal and to compensate for the gain setting arranged to be initiated by the first control signal.

14. The receiver according to claim 1, wherein each regulating device is configured to individually set the higher or lower gain setting.

15. The receiver according to claim 1, wherein the length of detection intervals are arranged such that the probability for a low threshold level detection should be substantially the same for each low threshold level.

16. An AGC Multilevel threshold detector Unit (AMU), comprising:
at least one Low Multilevel Threshold Detector (LMTD), and that said LMTD comprises at least two low threshold detectors, each of the at least two low threshold detectors having an associated low threshold level and detection interval, the selectable length of each detection interval selected to be shorter the lower each corresponding low threshold level is set.

17. A communication system comprising:
a receiver comprising:
an input end,
an Rx-chain with at least one regulating device,
an output end,
a feedback loop in the Rx-chain,
said at least one regulating device being arranged for providing a higher or a lower gain setting,
the feedback loop comprises an AGC Multilevel threshold detector Unit (AMU), the AMU comprising at least one Low Multilevel Threshold Detector (LMTD), and that said LMTD comprises at least two low threshold detectors, of the at least two low threshold detectors having an associated low threshold level and detection interval, the selectable length of each detection interval selected to be shorter the lower each corresponding low threshold level is set, the higher gain setting being arranged to be initiated through the feedback loop when the absolute level of an AGC input signal has been below at least one of the low threshold levels during the entire detection interval associated with that at least one low threshold level.

18. A method for adjusting a gain in a receiver, the method comprising:
providing the receiver comprising:
an input end,
an Rx-chain with at least one regulating device,
an output end,
a feedback loop in the Rx-chain,
said at least one regulating device being arranged for providing a higher or a lower gain setting,
the feedback loop comprises an AGC Multilevel threshold detector Unit (AMU), the AMU comprising at least one Low Multilevel Threshold Detector (LTMD), and that said LMTD comprises at least two low threshold detectors, each of the at least two low threshold detectors having an associated threshold level and detection interval, the selectable length of each detection interval selected to be shorter the lower each corresponding low threshold level is set, the higher gain setting being arranged to be initiated through the feedback loop when the absolute level of an AGC input signal has been below at least one of the low threshold levels during the entire detection interval associated with that at least one low threshold level;
wherein each low threshold detector having an associated low threshold level and detection interval;
setting the length of each detection interval to be shorter the lower each corresponding low threshold level is set; and
initiating the higher gain setting through the feedback loop when a low threshold level has been detected by the absolute level of an AGC input signal being below at least one of the low threshold levels during the entire detection interval associated with that at least one low threshold level.

* * * * *

UNITED STATES PATENT AND TRADEMARK OFFICE
CERTIFICATE OF CORRECTION

| | | |
|---|---|---|
| PATENT NO. | : 8,849,224 B2 | Page 1 of 2 |
| APPLICATION NO. | : 12/992692 | |
| DATED | : September 30, 2014 | |
| INVENTOR(S) | : Björk | |

It is certified that error appears in the above-identified patent and that said Letters Patent is hereby corrected as shown below:

On the title page, item 75 under "Inventor", in Column 1, Line 1, delete "Vimar Björk," and insert -- Wimar Björk, --, therefor.

In the specification

In Column 4, Line 53, delete "$S_2$" and insert -- $s_2$ --, therefor.

In Column 4, Line 60, delete "$S_4$" and insert -- $s_4$ --, therefor.

In Column 4, Line 62, delete "$S_4$" and insert -- $s_4$ --, therefor.

In Column 5, Line 3, delete "$S_6$" and insert -- $s_6$ --, therefor.

In Column 5, Line 4, delete "$S_{61}$" and insert -- $s_{61}$ --, therefor at each occurrence throughout the Specification.

In Column 5, Line 5, delete "$S_{62}$" and insert -- $s_{62}$ --, therefor.

In Column 5, Line 23, delete "$S_{62}$" and insert -- $s_{62}$ --, therefor.

In Column 5, Line 25, delete "$S_{62}$" and insert -- $s_{62}$ --, therefor.

In Column 5, Line 28, delete "$S_{71}$" and insert -- $s_{71}$ --, therefor.

In Column 5, Line 29, delete "$S_{72}$, the first path $S_{71}$" and insert -- $s_{72}$, the first path $s_{71}$ --, therefor.

In Column 5, Line 35, delete "$S_{81}$" and insert -- $s_{81}$ --, therefor.

In Column 5, Line 37, delete "$S_{82}$" and insert -- $s_{82}$ --, therefor.

Signed and Sealed this
Sixteenth Day of February, 2016

Michelle K. Lee
*Director of the United States Patent and Trademark Office*

CERTIFICATE OF CORRECTION (continued)
U.S. Pat. No. 8,849,224 B2

In the specification

In Column 6, Line 15, delete "$S_6$" and insert -- $s_5$ --, therefor.

In Column 10, Line 2, delete "r" and insert -- $r_n$ --, therefor.

In Column 10, Line 8, delete "r" and insert -- $r_n$ --, therefor.

In Column 12, Line 16, delete "attentions" and insert -- attenuations --, therefor.

In Column 13, Line 16, delete "$S_1$" and insert -- $s_1$ --, therefor.